United States Patent [19]

Dinwoodie

[11] Patent Number: 5,505,788
[45] Date of Patent: *Apr. 9, 1996

[54] THERMALLY REGULATED PHOTOVOLTAIC ROOFING ASSEMBLY

[76] Inventor: Thomas L. Dinwoodie, 2550 Benvenue, Berkeley, Calif. 94704

[*] Notice: The term of this patent shall not extend beyond the expiration date of Pat. No. 5,316,592.

[21] Appl. No.: 267,499

[22] Filed: Jun. 29, 1994

[51] Int. Cl.⁶ .......................... E04D 13/18; H01L 31/052
[52] U.S. Cl. .......................... 136/246; 136/244; 136/251; 136/291; 52/173.3
[58] Field of Search ................... 136/244, 246, 136/251, 291; 52/173.3

[56] References Cited

U.S. PATENT DOCUMENTS

| | | | |
|---|---|---|---|
| 3,769,091 | 10/1973 | Leinkram et al. | 136/246 |
| 4,040,867 | 8/1977 | Forestieri et al. | 136/244 |
| 4,189,881 | 2/1980 | Hawley | 52/220 |
| 4,321,416 | 3/1982 | Tennant | 136/244 |
| 4,389,533 | 6/1983 | Ames | 136/248 |
| 4,674,244 | 6/1987 | Francovitch | 52/173.3 |
| 4,677,248 | 6/1987 | Lacey | 136/244 |
| 4,835,918 | 1/1989 | Dippel | 52/63 |
| 4,860,509 | 10/1989 | Laaly et al. | 52/173.3 |
| 4,886,554 | 12/1989 | Woodring et al. | 136/244 |
| 5,092,393 | 3/1992 | Nath et al. | 136/251 |
| 5,112,408 | 5/1992 | Melchior | 136/251 |
| 5,316,592 | 5/1994 | Dinwoodie | 136/244 |
| 5,338,369 | 8/1994 | Rawlings | 136/246 |

FOREIGN PATENT DOCUMENTS

| | | | |
|---|---|---|---|
| 3611542 | 10/1987 | Germany | 136/246 |
| 3-200376 | 9/1991 | Japan | 136/251 |

Primary Examiner—Aaron Weisstuch
Attorney, Agent, or Firm—Townsend and Townsend and Crew

[57] ABSTRACT

A photovoltaic roofing assembly comprises a roofing membrane (102), a plurality of photovoltaic modules (104, 106, 108, 110) disposed as a layer on top of the roofing membrane (102), and a plurality of pre-formed spacers, pedestals or supports (112, 114, 116, 118, 120, 122) which are respectively disposed below the plurality of photovoltaic modules (104, 106, 108, 110) and integral therewith, or fixed thereto. Spacers (112, 114, 116, 118, 120, 122) are disposed on top of roofing membrane (102). Membrane (102) is supported on conventional roof framing, and attached thereto by conventional methods. In an alternative embodiment, the roofing assembly may have a tapered profile for orienting modules (204, 206, 208, 210) in a direction of increased sun exposure. Other embodiments include the use of phase change material for temperature regulation, and incorporating an insulation block into the assembly as a means of spacing and of building thermal control. Such construction results in a simple, readily assembled roofing assembly which regulates the temperature of the photovoltaic module and roofing membrane and avoids the need for rooting penetrations for hold-down to the building rooftop. Photovoltaic modules (104, 106, 108, 110) serve the purpose of electric generator, and in addition, the multiple purposes of ballast, UV block, and weather protector for the insulation block and roofing membrane below. A fluid convects within the passageways created by the spacers, transferring heat from the backside of the photovoltaic modules. Rainwater drains through the joints between the integral modules, onto and over the roofing membrane below.

43 Claims, 9 Drawing Sheets

THERMALLY REGULATED PHOTOVOLTAIC ROOFING ASSEMBLY

FIELD OF THE INVENTION

This invention generally relates to a photovoltaic roofing assembly, and in particular to a photovoltaic roofing assembly which can regulate the temperatures experienced by the solar cells and requires no roof penetrations for hold-down to the roof surface.

DESCRIPTION OF THE PRIOR ART

As the cost of solar cells declines, the non-solar cell components necessary for a functioning photovoltaic system begin to dominate the overall system costs. For this reason, there is a growing trend to develop photovoltaic assemblies which eliminate or reduce non-solar cell components, and where the photovoltaic cell displaces conventional building components. An integral photovoltaic roofing assembly can avoid the cost of purchasing or renting land, and/or constructing a support structure for the photovoltaic array. A further savings is achieved when the photovoltaic roofing assembly displaces the cost of purchasing and installing conventional roofing materials. Due to the extreme sensitivity of future photovoltaic markets to photovoltaic system costs, a key objective in developing a photovoltaic roofing assembly is to eliminate non-essential costs and components, in part by designing components to perform multiple functions.

A prior-an photovoltaic roofing assembly is shown in U.S. Pat. No. 4,886,554 issued Dec. 12, 1989 to Woodring et al. Woodring's assembly includes a plurality of insulation blocks disposed as a layer on top of a roofing membrane, a plurality of concrete pavers disposed as a layer on top of the plurality of insulation blocks, and a plurality of photovoltaic cells, each supported on a respective paver. A key feature of Woodring's assembly is the attachment of the solar cell to the supporting paver. But such attachment suffers from several disadvantages:

a) by including a roofing paver, the assembly is more complicated than necessary and more costly to manufacture.
 b) the assembly does not employ a method by which to limit the temperatures experienced by the solar cells and other components. Solar cells are known to decline in efficiency with increasing temperatures. Hence, by offering no mechanism for temperature abatement, the assembly will operate less efficiently, with unknown long-term effects due to high temperature exposure.
 c) by placing both a concrete paver and photovoltaic module onto the insulation block, the insulation block is inhibited from ventilating and expiring moisture. As a result, upon exposure to moisture, the insulation block takes longer to dry out, thus reducing its insulating value and degrading the integrity of the insulation block over time.
 d) the assembly has multiple modes of potential failure, which include the paver component and its means of bonding. These components will be subjected to 20–30 years of an exposed and harsh weather environment at elevated temperatures. Any form of delamination is unacceptable. Delamination would cause dislocation of solar cells due to wind loading, and potential exposure of the insulation and membrane layers below.

Another prior-an solar roofing assembly is shown in U.S. Pat. No. 4,674,244 issued Jun. 23, 1987 to Francovitch. Frankovitch's assembly includes a roof substrate which is substantially flat, an insulation structure thereon having an inclined surface, an elastomeric membrane over the substrate and the structure, the membrane being applied to and supported by the substrate and structure, and supporting an array of photocells. A key feature of this assembly is the attachment of the solar cell directly to the roofing membrane. By such attachment, this assembly suffers from several disadvantages:

a) the assembly does not employ a method by which to limit the temperatures that will be experienced by the solar cells and roofing membrane, thus reducing the efficiency of the solar cells and reducing the life of the roofing membrane.
 b) the assembly has multiple modes of potential failure, which include failure due to thermal stresses on the roofing membrane and its means of bonding.
 c) the assembly requires roof fasteners which penetrate the protective roofing membrane, which make the installation much more complicated and more costly than is necessary. In addition, such penetrations increase the risk of water leakage, with consequent damage to the building and its contents.

Another prior-art photovoltaic roofing assembly is shown in U.S. Pat. No. 5,316,592 issued May 31, 1994 to Dinwoodie. Dinwoodie's assembly includes a plurality of insulation blocks disposed as a layer on top of a roofing membrane, and a plurality of photovoltaic cells disposed as a layer on top of the insulation block. A key feature of Dinwoodie's assembly is the attachment of the solar cell to the insulation block. Such attachment suffers from a disadvantage in the use of certain photovoltaic cell materials. The assembly does not employ a method by which to limit the temperatures experienced by the photovoltaic cells, and hence will operate at less efficiency than otherwise. Other patents related to a photovoltaic roofing assembly include U.S. Pat. Nos. 4,835,9 18 issued Jun. 6, 1989 to Dippel; 4,189,881 issued Feb. 26, 1980 to Hawley; 3,769,091 issued Oct. 30, 1973 to Linkram et al; 4,040,867 issued Aug. 9, 1977 to Forestieri et al; 4,321,416 issued Mar. 23, 1982 to Tennant; 4,860,509 issued Aug. 29, 1989 to Laaly et al; 5,092,393 issued March, 1992 to Nath et al; and 5,112,408 issued May, 1992 to Melchior.

OBJECTS AND ADVANTAGES OF THE INVENTION

Accordingly, several objects and advantages of the present invention are:

a) to provide an improved roofing assembly which offers the following features: a photovoltaic portion which protects the insulation and membrane layers from ultraviolet radiation and adverse weather, thus extending the life of these components; a longer-lived roofing assembly, compatible with the life of the photovoltaic portion; a roofing assembly which weighs roughly one half the cost of conventional ballasted roofs; an assembly which works with virtually all built-up and single ply membranes; an assembly which has considerable safety factor against wind uplift; and an assembly which is free of CFC's.
 b) to provide a simple and low-cost photovoltaic roofing assembly, where components within the product provide multiple functions as follows:

1) the solar module provides multiple functions as a roofing component, including ballast, weather protection, and UV protection for the insulation and waterproof membrane below, and 2) a pre-formed structure supports the photovoltaic module, while facilitating temperature regulation through heat transfer to a convecting fluid and/or phase change material.

c) to provide a photovoltaic roofing assembly which limits temperatures experienced by the photovoltaic module and the roofing membrane, thus maximizing the efficiency of the solar cells, while prolonging the life of the roofing membrane. d) to provide a low-cost assembly which eliminates the need for roofing penetrations.

e) to provide a photovoltaic roofing assembly which enjoys ease of fabrication due to its simple construction.

f) to provide a product which preserves the integrity of the insulation layer of the building roof.

g) to provide a photovoltaic roofing assembly whereby, in its embodiment utilizing an insulation block as a layer between the photovoltaic module and roofing membrane, exposure of the photovoltaic modules and their respective electrical connections to moisture is minimized as a result of rainwater passing by the edges of the insulation block to the roofing membrane below, causing the entire assembly to "float" above the membrane.

h) to provide a photovoltaic roofing assembly that displaces the costs of conventional roofing materials and their installation, thereby enhancing the value of the photovoltaic portion as a synergistic building component.

i) to provide a product with minimal modes of potential failure.

j) to provide a product that is similar in construction to an existing commercial roofing assembly to facilitate acceptance by the market and by the construction trades.

k) to provide a roofing assembly which yields social benefits by making photovoltaic technology more cost competitive. This facilitates transition to a clean, renewable energy economy, and helps to mitigate air pollution and global warming.

The foregoing and other objects, advantages and novel features of the invention will be more fully apparent from the description of the preferred embodiments of the invention when read in connection with the accompanying drawings.

SUMMARY OF THE INVENTION

According to the present invention, a solar cell roofing assembly is formed with three portions. One portion consists of a conventional roofing membrane installed over rooting insulation which rests on conventional roof framing. A second portion consists of a plurality of photovoltaic modules, together with pre-formed spacers which enable heat exchange with a convecting fluid and/or phase change material. The photovoltaic modules with pre-formed spacers have interlocking edges. A third portion is a conventional rooting paver. The photovoltaic module portion is situated over the roofing membrane in a manner to be exposed to solar radiation and electrically connected for transport of electricity. The paver portion is situated over the same roofing membrane so is to provide walkways between aggregate areas of photovoltaic modules, and to provide perimeters around roof penetrations and equipment. The photovoltaic module performs the multiple functions normally provided by a roofing paver, including ballast, UV protection, and weather protection for the membrane and insulation layers below. A fan or pump unit may be added to force convection of the cooling fluid, which is preferably air, but could include other liquid or gaseous fluids. Together the three portions serve the dual function of a self-ballasted paver roofing system and a thermally regulated array of solar cells for the collection of radiant energy.

In an alternate embodiment, the solar cell roofing assembly is formed with four portions. The first portion consists of a roofing membrane which rests on conventional roof framing. The second portion consists of a plurality of insulation blocks. The third portion consists of a plurality of photovoltaic modules, together with pre-formed spacers which enable heat exchange with a convecting fluid and/or phase change material, and which rests on the plurality of insulation blocks. The insulation blocks with photovoltaic modules and pre-formed spacers have interlocking edges. The photovoltaic module performs the multiple functions normally provided by a roofing paver, including ballast, UV protection, and weather protection for the membrane and insulation layers below.

A fourth portion of this alternate embodiment is a conventional roofing paver, located between aggregate areas of the photovoltaic modules, which provides walkways and perimeters around roof penetrations and equipment. Together the four portions serve the dual function of a protected membrane roofing system and a thermally regulated array of solar cells for the collection of radiant energy.

DETAILED DESCRIPTION OF THE INVENTION

Description off FIGS. 1a–1d: Flat Profile with Convective Layer

Figure 1A:
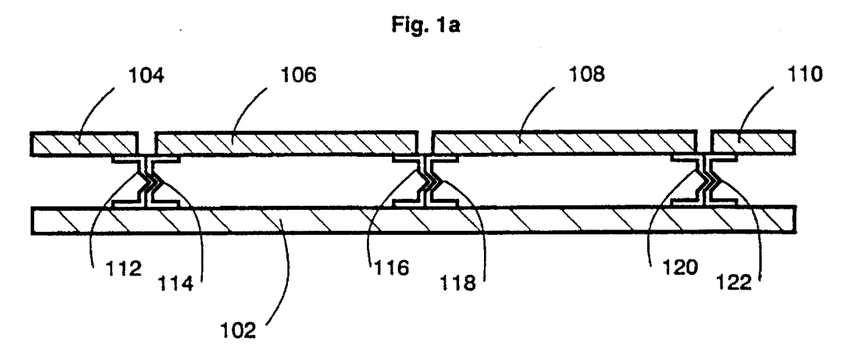
FIGS. 1a to 1d show sectional views of the invention with a flat profile and configured to enable fluid convection below the photovoltaic modules.

FIG. 1a shows a sectional view of a photovoltaic roofing assembly. The assembly includes a plurality of photovoltaic modules 104, 106, 108, 110, a plurality of preformed spacers, pedestals, or supports 112, 114, 116, 118, 120, 122 which are respectively disposed below the plurality of photovoltaic modules 104, 106, 108, 110 and integral therewith, or fixedly connected thereto. Spacers 112, 114, 116, 118, 120, 122 are disposed on top of a roofing membrane 102.

Membrane 102 is supported on conventional roof framing (not shown), and attached thereto by conventional methods, such as fasteners or adhesives. Membrane 102 may also rest directly on insulation block which is supported on conventional roof framing. Modules 104, 106, 108, 110 are connected to conventional conductors (not shown) and are arranged in an array of modules. Each of modules 104, 106, 108, 110 has at least one photovoltaic cell. Examples of photovoltaic modules include those incorporating thin-film deposition onto glass, stainless steel or ceramic substrates and manufactured by such companies as Advanced Photovoltaic Systems, Inc., Solarex Corporation, United Solar Systems Corporation, and Astropower, Inc., and modules of single or polycrystalline silicon cells such as those manufactured by Texas Instruments, Astropower, Inc., Siemens Solar Industries, and Solarex Corporation.

Figure 1B:
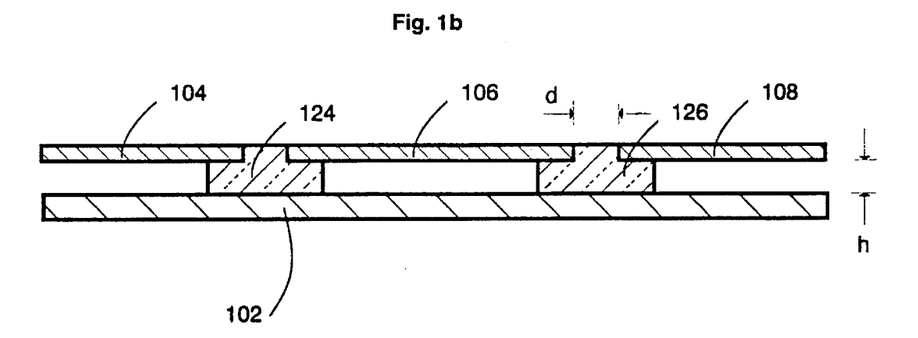

Spacers 112, 114, 116, 118, 120, 122 of the assembly can take several forms, including linear channels, point supports, or area supports. FIG. 1*b* shows a sectional view of an embodiment of the assembly wherein pre-formed spacers 124, 126 are disposed on top of membrane 102 and provide point support along the edges or corners for modules 104, 106, 108 to which they are fixedly connected or made integral. FIG. 1*b* shows dimension d, representing the spacing between modules, and dimension h, representing the distance between the module and the roofing membrane. The assembly has preferred dimensions whereby h measures ½ inch to 4 inches, depending upon the temperature to which the module and other components are to be limited. In addition, the ratio of d/h preferably approaches 2 or greater in order to facilitate pressure equalization between the top and bottom side of the photovoltaic modules, thus reducing the forces of wind uplift. The photovoltaic modules are preferably sized in the range of 1 ft by 1 ft to 4 ft by 8 ft, in order to be readily handled by a roofing installation crew. The size and number of the spacers are minimized in order to minimize material costs, but sufficient to provide support for the photovoltaic modules in accordance with the module material strength.

Figure 1C:
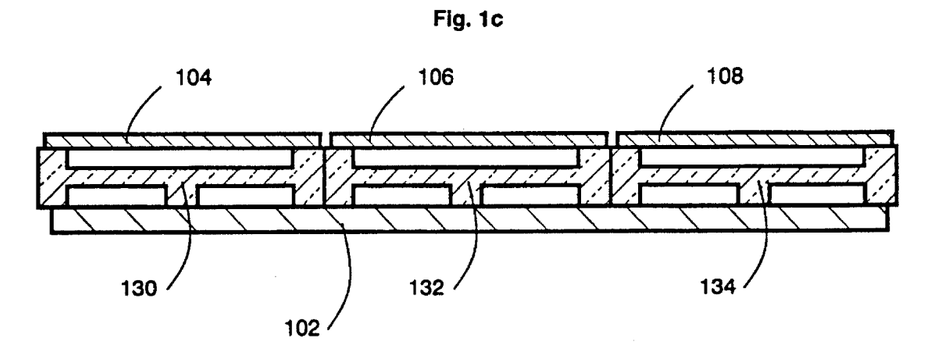

FIG. 1*c* shows a sectional view of an alternate embodiment of the assembly wherein spacers 130, 132, 134 are disposed on top of membrane 102 and provide area support for modules 104, 106, 108 to which they are fixedly connected or made integral. Spacers 130, 132, 134 may be made of glass, concrete, plastic, insulation block, integral concrete over insulation block (such as the product known as Lightguard™, by T. Clear Corporation), or other material. The spacing and dimensions of the spacers are predetermined to provide multiple functions, including temperature modulation resulting from heat exchange by fluid convection on the backside of modules 104, 106, 108, enabling pressure equalization between the top side and bottom side of modules 104, 106, 108, and enabling drainage of rainwater.

Figure 1D:
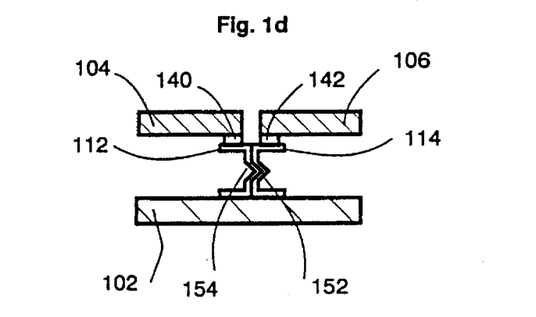

FIG. 1*d* shows an expanded view of spacer 112, 114 which is identical in construction to spacers 116, 118, 120, 122 and has a top adhesive layer 140, 142 for bonding or laminating modules 104, 106, 108 thereto in the field or in the shop. However, any system can be used for attaching modules 104, 106, 108 to the spacers. In addition, it is possible to avoid positive attachment of the spacers to the modules provided the modules have positive edge to edge connection. Spacer 114, which is identical to spacers 118, 122 preferably has a grooved profile 152, and spacer 112, which is identical to spacers 116, 120 preferably has a tongued profile 154. In this way, interlocking joints are formed between adjacent integral assemblies for better resistance to wind uplift. However, any means of integral locking is possible.

The preferred method of manufacture of the solar roofing assembly is indicated as follows: Modules 104, 106, 108, 110 are added to, bonded to, or otherwise attached to, respective spacers 112, 114, 116, 118, 120, 122, 124, 126, 130, 132, 134 in the manufacturing plant or in the field. A roofing membrane is placed on a roof. The modules and spacers are placed in arrays on top of the roof membrane. Roofing pavers are situated around the perimeter of photovoltaic module Such construction results in a simple, readily assembled roofing assembly which regulates the temperature of the photovoltaic module and roofing membrane. A semi-continuous spatial layer is created below photovoltaic modules 104, 106, 108, 110 which enables the convection of a fluid, preferably air, through passageways created by the spacers. The fluid convects within the passageways created by the spacers, transferring heat from the backside of the photovoltaic modules. A fan or pump unit may be added to three convection of the fluid. Rainwater drains through the joints between the integral modules, onto and over the roofing membrane below.

The advantages of the foregoing assembly include:

1. The photovoltaic roofing assembly, which can be used on a flat or mildly sloping roof, minimizes water leakage through the roof.
2. A pre-formed pedestal or spacer supports the photovoltaic module while facilitating temperature regulation through heat transfer to a convecting fluid.
3. The photovoltaic module provides multiple functions as a roofing component, including ballast, weather protection, and UV protection for the membrane layer below.
4. By displacing roofing components and their installation, the value of the photovoltaic module is enhanced, thereby enhancing the cost-competitiveness of energy from a clean and renewable resource.
5. The assembly is lightweight relative to conventional roofing assemblies, relying on a combination of ballast weight and edge to edge connection to resist the forces of wind uplift.
6. Modules 104, 106, 108, 110 are interconnected, which prevents dislodging of individual modules, because each module is held in place by its adjoining modules.
7. The cost of installation of the assembly is minimized due to ease of fabrication and simple construction. Quality control is maximized by using shop-assembled integral.
8. The solar roofing modules are reusable. They can be readily disconnected and reassembled onto other roof tops.
9. The force of wind uplift at the interface between the module and paver portions of the assembly is reduced by introducing a spoiler of laminar air flow. This spoiler may provide multiple functions as 1) edge to edge connection between module and paver portions of the assembly, and 2) raceway for electrical wiring.

Figure 2A:
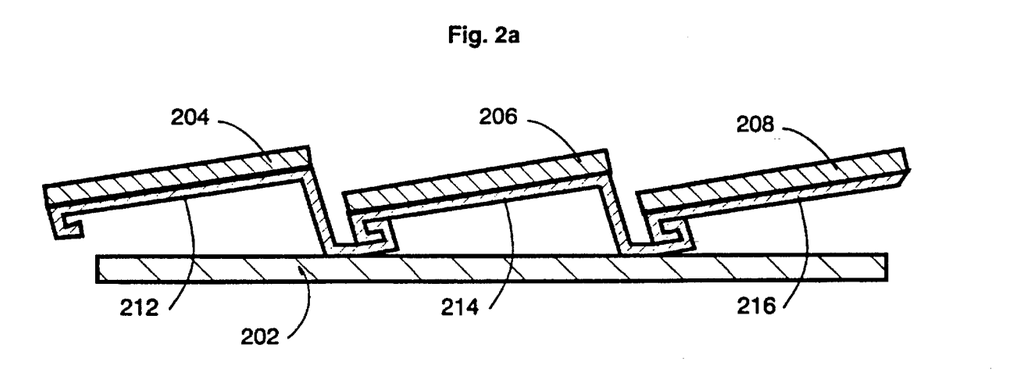
FIGS. 2a to 2c show sectional views of a second embodiment of the invention, whereby the invention shown in FIG. 1 has a tapered profile.
Figure 2B:
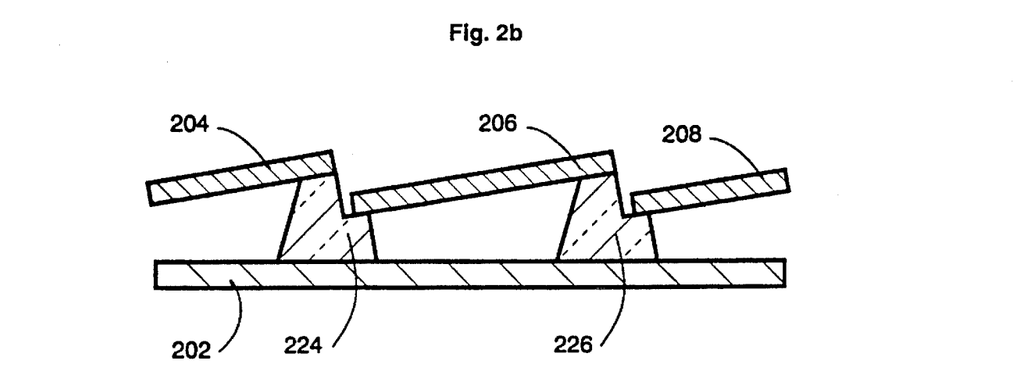
Figure 2C:
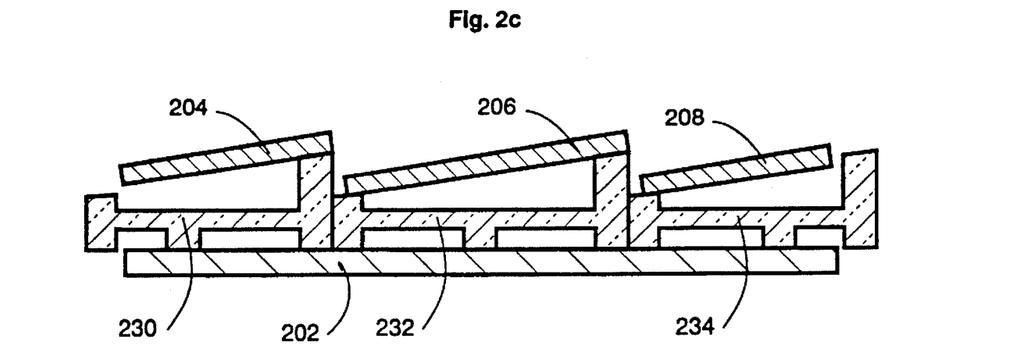

Description of FIGS. 2*a*–2*c*: Tapered Profile with Convective Layer

FIGS. 2*a*–2*c* show sectional views of a second embodiment of the invention. In FIG. 2*a*, the assembly includes a plurality of photovoltaic modules 204, 206, 208, a plurality of pre-formed spacers, pedestals or supports 212, 214, 216 which are respectively disposed below modules 204, 206, 208 and integral therewith, or fixed thereto. The spacers 212, 214, 216 are disposed on top of a roofing membrane 202.

Spacers 212, 214, 216 of the assembly can take several forms, including linear channels, point supports, or area supports.

FIG. 2b shows a sectional view of an embodiment of the assembly wherein spacers 224, 226 are disposed on top of membrane 202 and provide point support along the edges or corners for modules 204, 206, 208 to which they are fixedly connected or made integral. Spacers 224, 226 also ensure consistent spacing between modules 204, 206, 208 and enable water drainage.

FIG. 2c shows a sectional view of an alternate embodiment of the assembly wherein spacers 230, 232, 234 are disposed on top of membrane 202 and provide area support for modules 204, 206, 208 to which they are fixedly connected or made integral. Spacers 230, 232, 234 may be made of glass, concrete, plastic, insulation block, or other material.

In the photovoltaic roofing assembly of FIG. 2 with a tapered profile, the distance between adjoining edges of the photovoltaic modules may be minimized, as the modules may ventilate by natural convective means on their back side.

The advantages of the assembly of FIG. 2, which are in addition to the advantages of the assembly shown in FIG. 1, include:

1. Inclined photovoltaic modules 204, 206, 208 operate at a relatively high efficiency, due to their top surfaces being close to a plane normal to solar radiation.
2. By inclining the photovoltaic modules, natural convection using outside air as a convection fluid is enhanced, due to the facilitation of convective currents on the backside of a planar surface when that surface is inclined.
3. By inclining the photovoltaic modules, the top planar surface of the array of modules presents a rough surface to wind currents flowing over the top of the modules, as opposed to a smooth surface when the modules are not inclined. Such a rough surface serves to disrupt the laminar flow of wind, thereby reducing the forces of wind uplift. This condition is true up to a limit on the height differential between the uppermost and lowermost edges of the photovoltaic modules. Beyond a certain height differential, the modules will "catch" the wind, and the design loses efficiency in terms of reducing the forces of wind uplift. The allowable height differential is a complex function of the module weight, the nature of the edge to edge connection, the module size, and other factors. Wind tunnel testing is required to verify the relative height dimensions for each set of module conditions.

Description of FIGS. 3a–3d: Flat Profile with Phase Change Material

Figure 3A:
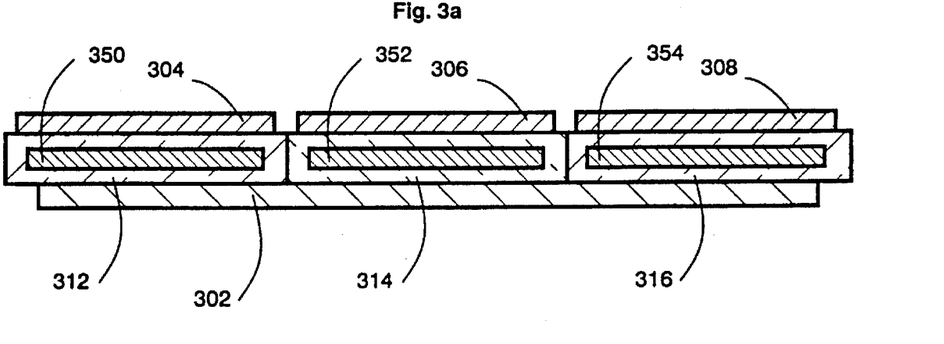
FIGS. 3a to 3c show sectional views of a third embodiment, whereby the invention has incorporates a phase change material and has a flat profile.
Figure 3B:
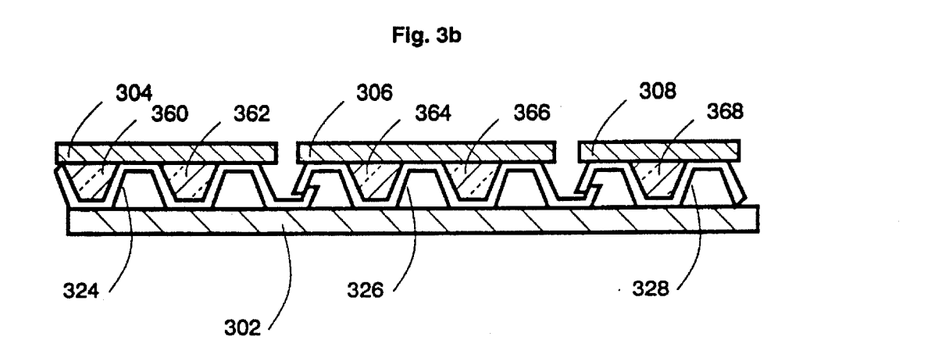
Figure 3C:
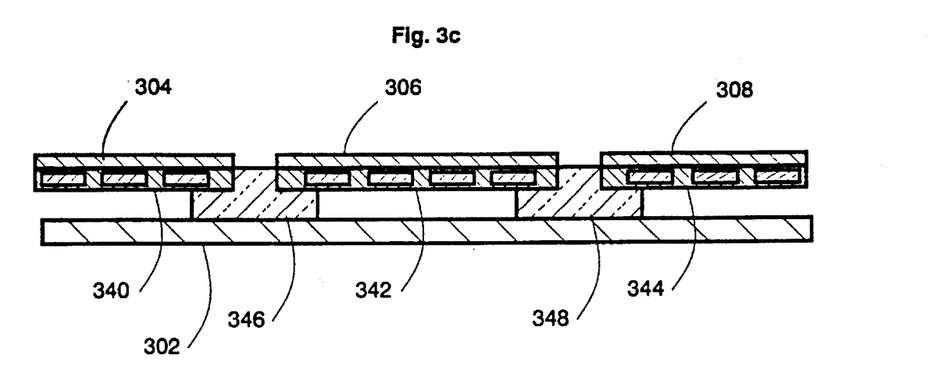

FIGS. 3a–3c show sectional views of a third embodiment of the invention. In FIG. 3a, the assembly includes a plurality of photovoltaic modules 304, 306, 308, a plurality of pre-formed containers or supports 312, 314, 316 which are respectively disposed below the plurality of modules 304, 306, 308 and integral therewith, or fixed thereto.

Containers 312, 314, 316 are disposed on top of a roofing membrane 302.

Containers 312, 314, 316 of the assembly may be made of open-cell foam, concrete, or other material into which a phase change material 350, 352, 354 has been imbibed or otherwise contained. A phase change material is a material which absorbs a relatively high amount of heat energy per unit of weight in the process of changing phase from a solid to liquid at its melting point temperature, or from a liquid to gas at its boiling point temperature. The amount of heat absorbed in each case is commonly referred to as the material's heat of fusion and heat of vaporization, respectively.

The means of containment of a phase change material 350, 352, 354 can take several forms. FIG. 3b shows pre-formed assemblies 324, 326, 328 which are preferably metal in order to conduct heat more effectively and form pockets or channels to enable transfer of heat from phase change material 360, 362, 364, 366, 368 to a convecting fluid, preferably air.

FIG. 3c shows a sectional view of a commercially available aluminum sandwich honeycomb structure 340, 342, 344 which contains phase change material and which is bonded to the bottom side of modules 304, 306, 308 and supported on spacers 346, 348.

The phase change material is preferably of the type known as linear crystalline alkyl hydrocarbons due to their low cost and melting temperatures in the range of 35–70 degrees centigrade.

The advantages of the assembly of FIG. 3, which are in addition to the advantages of the assembly shown in FIG. 1, include:

1. By incorporating a phase change material with a predetermined melting point temperature, it is possible to specify precisely the maximum temperature experienced by the assembly and also by the building roof below. By doing so, the photovoltaic module efficiency is enhanced, and the building thermal efficiency is increased.
2. The container of the phase change material can also serve as spacer or support structure for the photovoltaic module, thus reducing material costs.
3. The assembly of FIG. 3 is especially suited for thin-film photovoltaic materials which can benefit from lamination to a rigid substrate. An example is the photovoltaic "bead" technology developed by Texas Instruments, Inc. which incorporates crystalline silicon beads onto a thin metal foil.

Figure 4A:
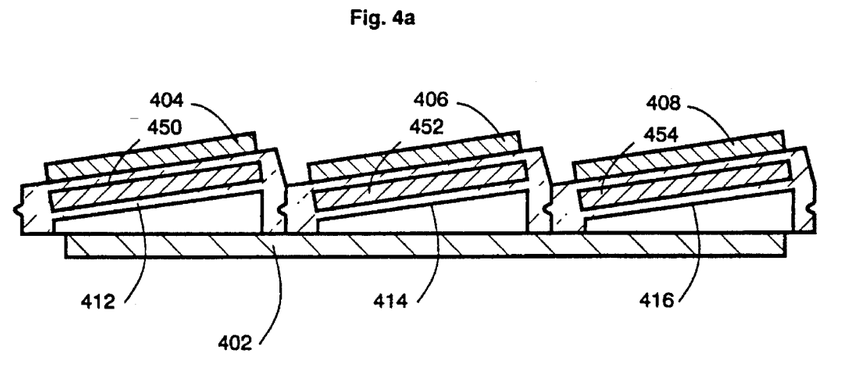
FIGS. 4a to 4c show sectional views of a fourth embodiment, whereby the invention of FIG. 3 has a tapered profile.
Figure 4B:
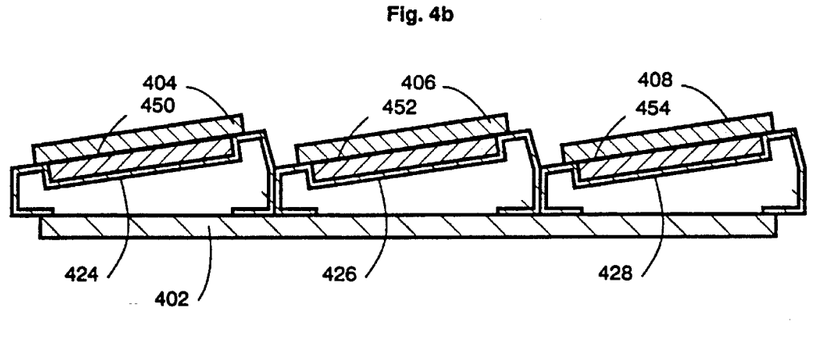
Figure 4C:
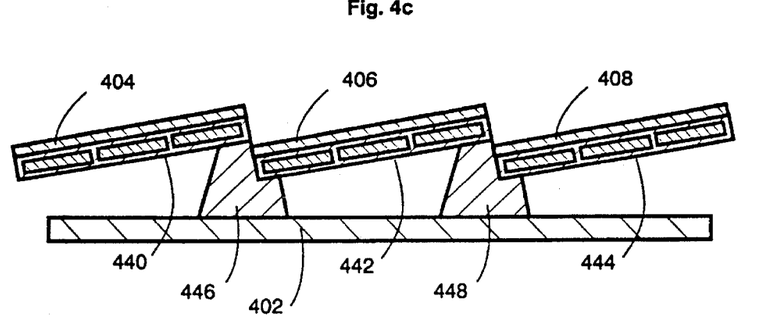

Description of FIGS. 4a–4c: Tapered Profile with Phase Change Material

FIGS. 4a–4c show sectional views of a fourth embodiment of the invention. In FIG. 4a, the assembly includes a plurality of photovoltaic modules 404, 406, 408, a plurality of pre-formed containers or supports 412, 414, 416, which are respectively disposed below the plurality of modules 404, 406, 408, and integral therewith, or fixed thereto. Containers 412, 414, 416, are disposed on top of a roofing membrane 402.

Containers 412, 414, 416 of the assembly may be made of open-cell foam, concrete, metal or other material into which a phase change material 450, 452, 454 has been imbibed or otherwise contained. However, the means of containment of phase change material 450, 452, 454 can take several forms.

FIG. 4b shows means of containment using pre-formed pockets or channels 424, 426, 428.

FIG. 4c shows a detail of a sectional view of a commercially available aluminum sandwich honeycomb structure 440, 442, 444 which contains phase change material and which is bonded to the bottom side of modules 406, 408 and supported on spacers 446, 448.

The advantages of the assembly of FIG. 4, which are in addition to the advantages of the assembly shown in FIG. 1 and FIG. 3, include:

1. Inclined photovoltaic modules 404, 406, 408 operate at a relatively high efficiency, due to their top surfaces being close to a plane normal to solar radiation.
2. By inclining the photovoltaic modules, natural convection using outside air as a convection fluid is enhanced. This will result in the need for less phase change material in reducing peak temperatures, thus reducing material costs for the assembly.
3. By inclining the photovoltaic modules, the top planar surface of the array of modules presents a rough surface to wind currents flowing over the top of the modules. A rough surface of pre-determined dimensions can serve to disrupt laminar flow, thereby reducing the forces of wind uplift.

Figure 5A:
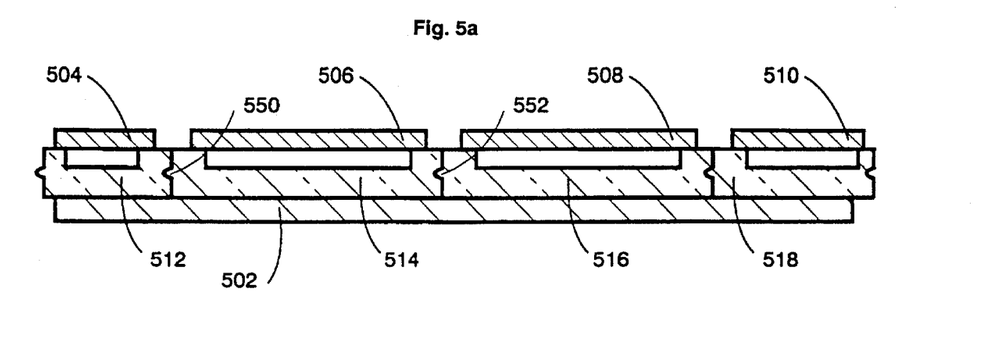
FIGS. 5a to 5c show sectional views of a fifth embodiment, whereby the invention includes an insulation block above the roofing membrane and has a flat profile.

Description of FIGS. 5a–5e: Flat Profile with Insulation Block and Convective Layer FIG. 5a shows a sectional view of a fifth embodiment of the invention. The assembly includes a plurality of photovoltaic modules 504, 506, 508, 510, a plurality of proformed insulation blocks 512, 514, 516, 518 which are respectively disposed below the plurality of modules 504, 506, 508, 510 and integral therewith, or fixedly connected thereto. Insulation blocks 512, 514, 516, 518 are disposed on top of a roofing membrane 502. Insulation block 514, which is identical in construction to insulation blocks 512, 516, 518, preferably has a grooved profile 550 along one edge, and a tongued profile 552 along the opposite edge. In this way, interlocking joints are formed between adjacent assemblies for better resistance to wind uplift. However, any means of integral locking is possible.

Figure 5B:
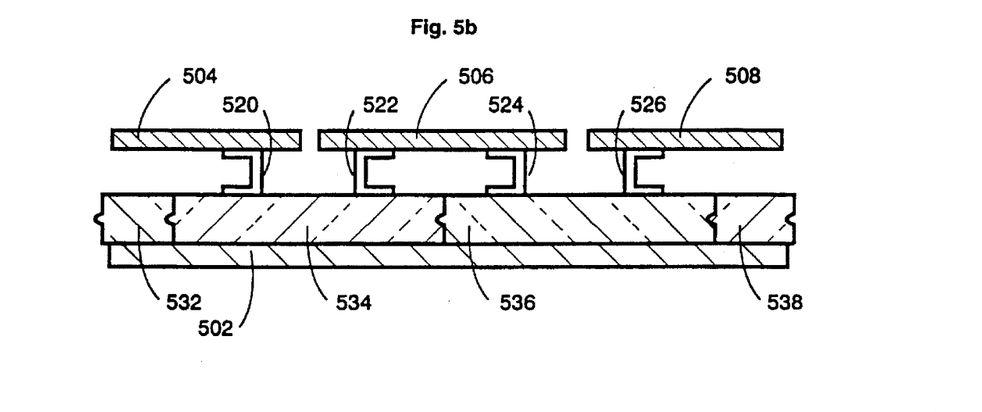

In FIG. 5b, modules 504, 506, 508 of the roofing assembly are connected to spacers, pedestals or supports 520, 522, 524, 526 which rest on insulation blocks 532, 534, 536 situated over roofing membrane 502. Module 506, attached to spacers 522, 524 may span and be bonded to insulation blocks 532, 534 in order to provide a positive connection between adjacent insulation blocks 532, 534. In this way, module 506 and module 508 may positively connect insulation blocks 534, 536 and 536, 538, respectively, forming an edge to edge integral assembly. However, any means of positive connection between modules 504, 506, 508 is possible. Spacers 520, 522, 524, 526 may be made of metal, insulation block, plastic, fiberglass, or other material and have pre-determined spacing and dimensions to provide multiple functions, including enabling heat exchange by fluid convection on the backside of modules 504, 506, 508; enabling pressure equalization between the topside and bottomside of modules 504, 506, 508; enabling insulation blocks 532, 534, 536 to ventilate and expire moisture, thus maintaining their insulation value and extending their life; and enabling drainage of rainwater.

Figure 5C:
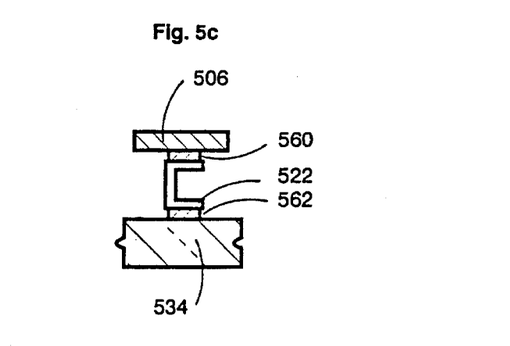

FIG. 5c shows an expanded view of spacer 522, which is identical in construction to spacers 520, 524, 526 and has a top adhesive layer 560 for bonding or laminating module 506 thereto in the field or in the shop. Spacer 522 has a bottom adhesive layer 562 for bonding or laminating insulation block 534 thereto in the field or in the shop. However, any system can be used for attaching module 506 to spacer 522 and spacer 522 to insulation block 532.

The preferred method of fabrication of the solar roofing assembly is indicated hereafter. Insulation blocks 512, 514, 516, 518 are bonded or otherwise attached on their top surface to modules 504, 506, 508, 510 either in the shop, thereby forming a shop-assembled, two-layer solar roofing module, or at the site of construction. The solar roofing modules are laid in the field over roofing membrane 502. Roofing pavers are situated around the arrays of solar roofing modules. Electrical raceways are installed along those edges of the array of solar roofing modules, or the raceways are made integral to the solar roofing modules or roofing pavers.

Such construction results in a simple, readily assembled roofing assembly which regulates the temperature of the photovoltaic module and roofing membrane. A semi-continuous spatial layer created below modules 504, 506, 508, 510 enables the convection of a fluid, preferably air. The fluid convects within the passageways created by the pre-formed insulation blocks or spacers, transferring heat from the backside of the photovoltaic modules. A fan or pump unit may be added to force convection of the fluid. Rainwater drains through the joints between the integral modules, onto and over the roofing membrane below.

The advantages of the assembly of FIG. 5, which are in addition to the advantages of the assembly shown in FIG. 1, include:

1. The assembly provides added protection for the roofing membrane against degradation resulting from exposure to ultraviolet radiation, weather elements, and from high temperatures, thus extending the life of the membrane.
2. The assembly displaces the need for building insulation placed below the roofing membrane.
3. By placing building insulation above the roofing membrane, moisture condensation is eliminated from the building's interior, since the dew point temperature is located above the membrane.
4. Since rainwater travels between the edges of the insulation block to form a layer between the insulation blocks and the roofing membrane below, the insulation block, spacers and photovoltaic modules will float as an integral unit over the rainwater. With the assembly floating above the rainwater, the photovoltaic modules and their respective electrical connectors are less exposed to moisture, thus extending their life and increasing the safety and reliability of the system. This is particularly important in those applications where the rooftop drainage system is not adequate to drain the roof quickly.
5. By making a positive connection edge-to-edge between adjacent PV modules, the assembly avoids the need for roof hold-downs and penetrations, thus reducing the cost and complexity of the installed system.

Figure 6A:
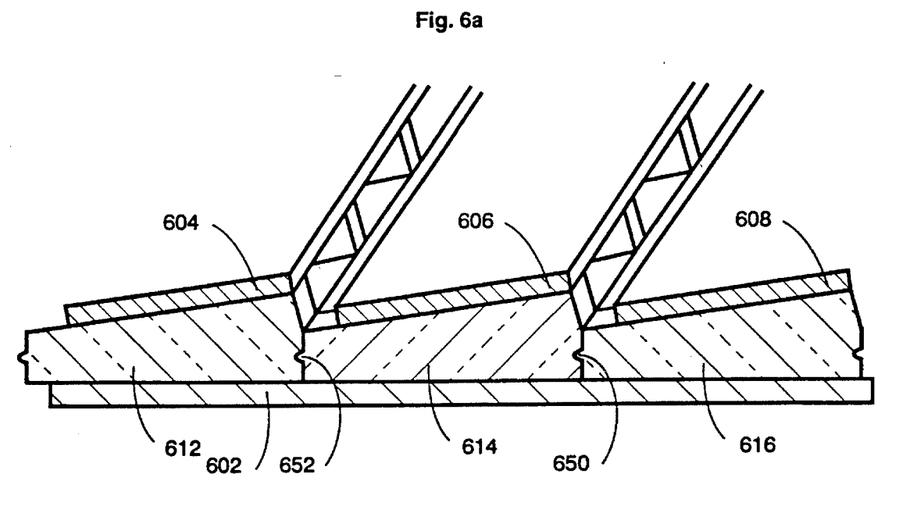
FIGS. 6a to 6b show sectional views of a sixth embodiment, whereby the invention of FIG. 5 has a tapered profile.
Figure 6B:
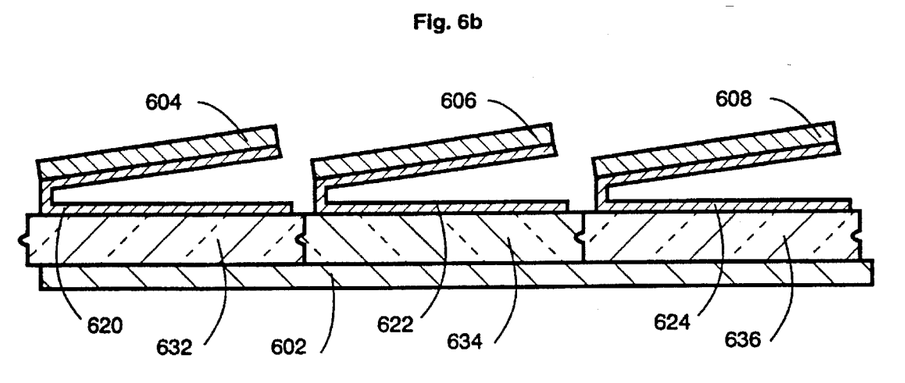

Description of FIGS. 6a–6b: Tapered Profile with Insulation Block and Convective Layer FIGS. 6a–6b show sectional views of a sixth embodiment of the invention. In FIG. 6a, the assembly includes a plurality of photovoltaic modules 604, 606, 608, a plurality of insulation blocks 612, 614, 616 respectively disposed below the plurality of modules 604, 606, 608 and integral therewith, or fixed thereto. Insulation blocks 612, 614, 616 are disposed on top of a roofing membrane 602 and have a tapered profile in order to orient modules 604, 606, 608 toward a direction of increased sun exposure.

Insulation block 614, which is identical in construction to insulation blocks 612, 616, preferably has a grooved profile 650 along one edge, and a tongued profile 652 along the opposite edge. In this way, interlocking joints are formed between adjacent assemblies for better resistance to wind uplift. However, any means of integral locking is possible.

In FIG. 6b, a variation of the assembly of FIG. 6a shows photovoltaic modules 604, 606, 608 connected to spacers, pedestals or supports 620, 622, 624 which rest on insulation blocks 632, 634, 636 situated over roofing membrane 602.

The advantages of the assembly of FIG. 6, which are in addition to the advantages of the assembly shown in FIG. 5, include:

1. Inclined photovoltaic modules 604, 606, 608 operate at a relatively high efficiency, due to their top surfaces being close to a plane normal to solar radiation.
2. By inclining the photovoltaic modules, natural convection using outside air as a convection fluid is enhanced. This will result in the need for less phase change material in shaving peak temperatures, thus reducing material costs for the assembly.
3. By inclining the photovoltaic modules, the top planar surface of the array of modules presents a rough surface to wind currents flowing over the top of the modules. A rough surface serves to disrupt laminar flow, thereby reducing the forces of wind uplift.

Figure 7A:
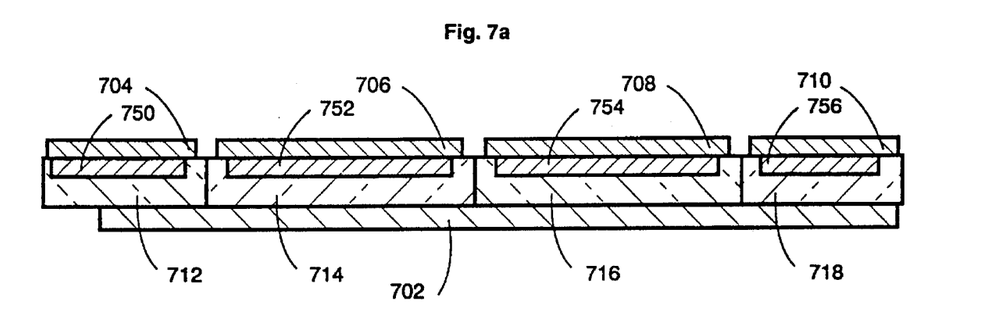
FIGS. 7a to 7c show sectional views of a seventh embodiment, whereby the invention of FIG. 6 incorporates a phase change material and has a flat profile.
Figure 7B:
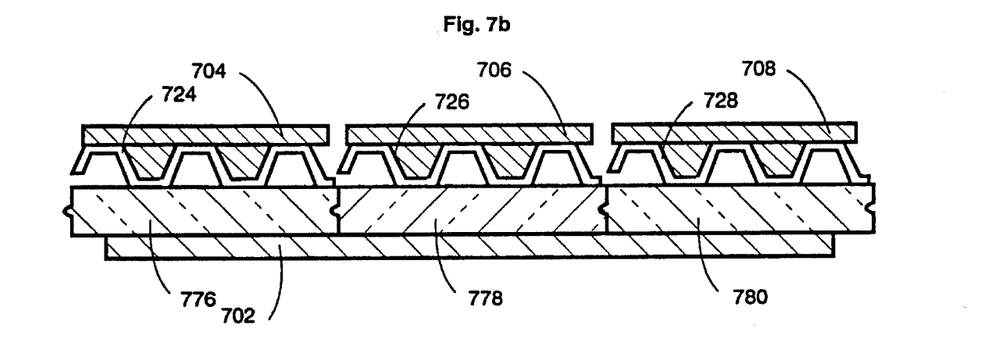
Figure 7C:
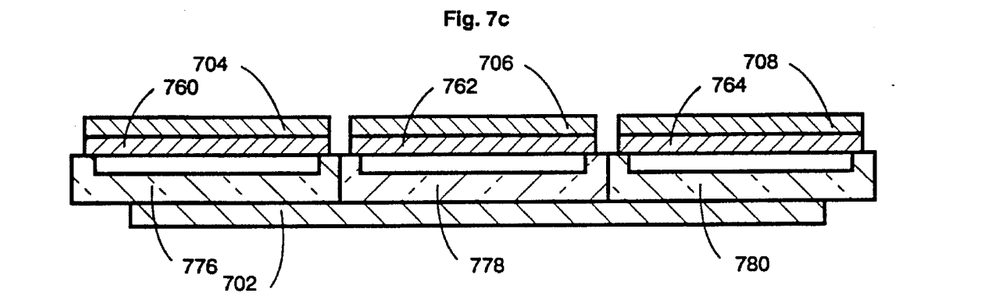

Description of FIGS. 7a–7c: Flat Profile with Insulation Block and Phase Change Material FIGS. 7a–7c show sectional views of a seventh embodiment of the invention. In FIG. 7a, the assembly includes a plurality of photovoltaic modules 704, 706, 708, 710, a plurality of pre-formed insulation blocks 712, 714, 716, 718 which are respectively disposed below the plurality of photovoltaic modules 704, 706, 708, 710 and integral therewith, or fixed thereto. Insulation blocks 712, 714, 716, 718 are disposed on top of a roofing membrane 702. Insulation blocks 712, 714, 716, 718 of the assembly contain a phase change material 750, 752, 754, 756.

Whereas the assembly shows insulation blocks 712, 714, 716, 718 as a means of containment of phase change material 750, 752, 754, 756, the means of containment can take several forms.

FIG. 7b shows pre-formed containers 724, 726, 728 which contain phase change material and which are formed to enable fluid convection for transferring heat away from the phase change material. Channels 724, 726, 728 are preferably metal in order to conduct heat effectively.

FIG. 7c shows a sectional view of a commercially available aluminum sandwich honeycomb structure 760, 762, 764 which contains phase change material and which is bonded to the bottom side of modules 704, 706, 708 and supported on insulation block 776, 778, 780.

Alternatively, the photovoltaic modules, bonded to the honeycomb structure could rest on spacers over the roofing membrane.

The advantage of the assembly of FIG. 7 is that it combines the advantages of the assemblies of FIG. 3 and FIG. 5.

Figure 8A:
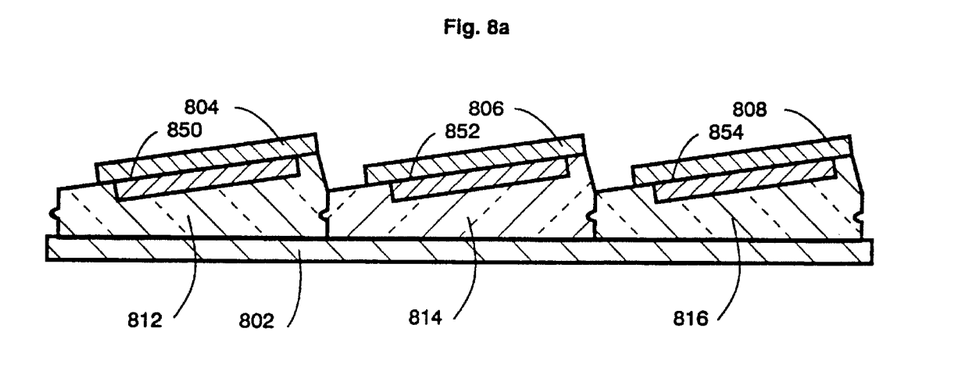
FIGS. 8a to 8c show sectional views of an eighth embodiment, whereby the invention of FIG. 7 has a tapered profile.
Figure 8B:
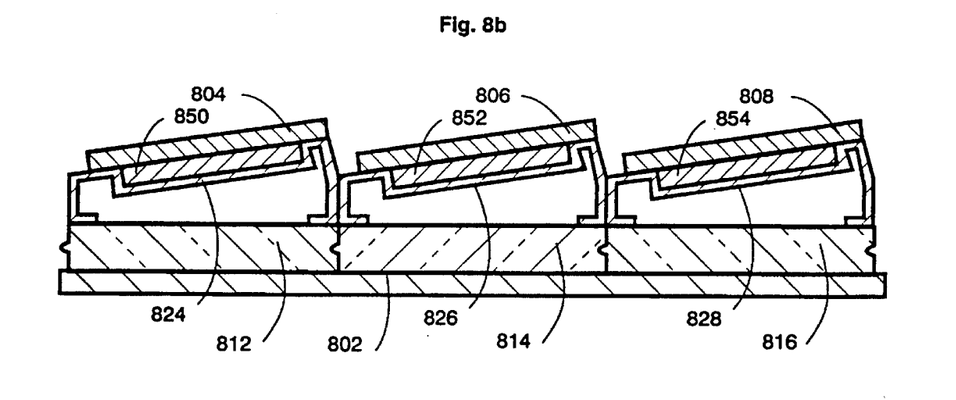
Figure 8C:
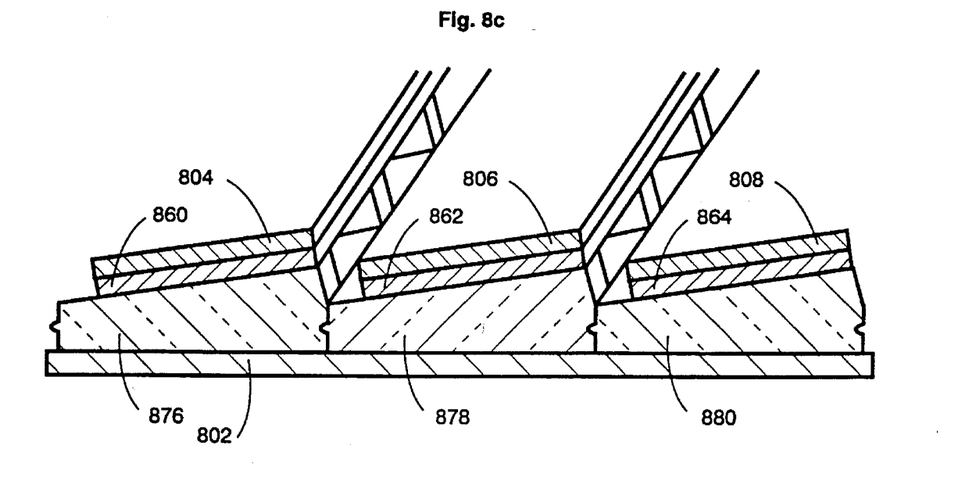

Description of FIGS. 8a–8c: Tapered Profile with Insulation Block and Phase Change Material FIGS. 8a–8c show sectional views of an eighth embodiment of the invention. In FIG. 8a, the assembly includes a plurality of photovoltaic modules 804, 806, 808, a plurality of pre-formed insulation blocks 812, 814, 816 which are respectively disposed below the plurality of modules 804, 806, 808 and integral therewith, or fixed thereto. Insulation blocks 812, 814, 816 are disposed on top of a roofing membrane 802 and have a tapered profile for orientation of their sloped surface in the direction of maximum sun exposure. Insulation blocks 812, 814, 816 contain phase change material 850, 852, 854.

Whereas the assembly of FIG. 8a shows insulation blocks 812, 814, 816 as a means of containment of phase change material 850, 852, 854, the means of containment of a phase change material can take several forms.

FIG. 8b shows pre-formed containers 824, 826, 828 which are shaped to contain phase change material 850, 852, 854 and to enable fluid convection for transferring heat. Containers 824, 826, 828 are preferably metal in order to conduct heat effectively.

Alternatively, FIG. 7c shows a sectional view of a commercially available aluminum sandwich honeycomb structure 860, 862, 864 which contains phase change material and which is bonded to the bottom side of modules 804, 806, 808 and supported on insulation blocks 876, 878, 880.

The advantage of the assembly of FIG. 8 is that it combines the advantages of the assemblies of FIG. 4 and FIG. 5.

Figure 9:
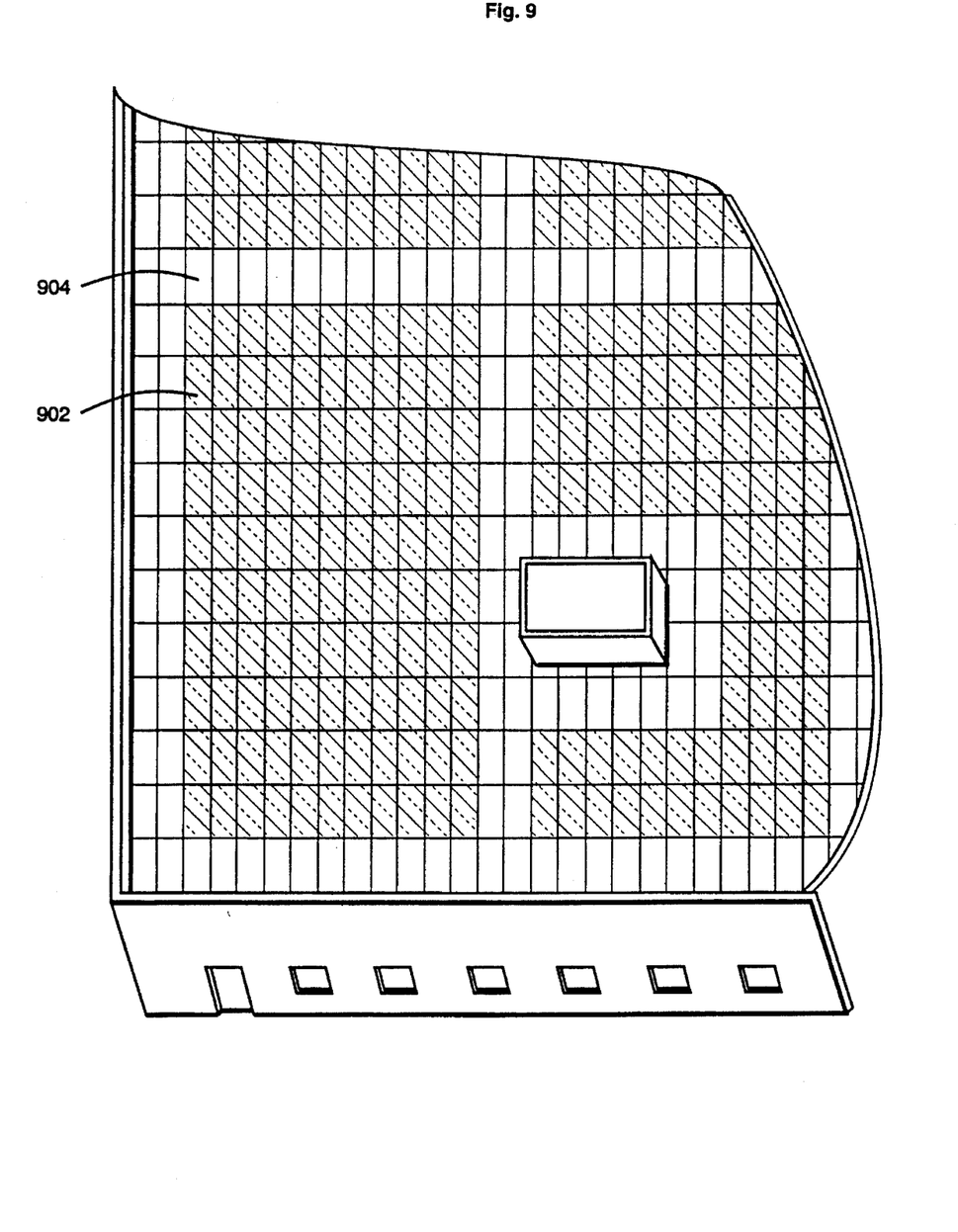
FIG. 9 shows a plan view of a building with a photovoltaic roofing assembly installed according to the invention.

Description of FIG. 9: Perspective View of the Photovoltaic Roofing Assembly FIG. 9 shows a perspective view of the photovoltaic roofing assembly where solar roofing modules form an array 902 which is situated on a building rooftop. Roofing paver sections 904 are situated between predetermined areas of array 902 to provide walkways and perimeters around roof penetrations, such as vents, and around roof equipment, such as heating, ventilating, and air conditioning equipment.

While the invention has been described in its preferred embodiments, it is to be understood that the words which have been used are words of description rather than limitation and that changes may be made within the purview of the appended claims without departing from the true scope and spirit of the invention in its broader aspects.

SUMMARY, RAMIFICATIONS, AND SCOPE

The present invention provides a simple, efficient, quickly installed, reusable, and low-cost solar module assembly for roofs or other flat or mildly sloping surfaces.

While the above description contains many specificities, these should not be construed as limitations on the scope of the invention, but rather as an exemplification of one preferred embodiment thereof. Many other variations are possible.

For example, the integral solar module unit consisting of a solar module bonded to insulation block can be utilized independent of a roofing membrane.

As a further example, the solar roofing assembly may include an additional layer consisting of fabric or other material disposed above the roofing membrane and below the photovoltaic module with spacers, which layer may provide an additional protective barrier for the roofing membrane and/or slipsheet.

As a further example, the solar modules with pedestals or spacers may include leveling plates placed under or over the pedestals or spacers for leveling the photovoltaic modules, or for achieving a pre-determined slope of the photovoltaic modules.

As a further example, the insulation block may be coated with an intumescent coating or other means of fireproofing in order to achieve a desired fire rating as a building roofing assembly.

As a further example, whereas the edge-to-edge connection between adjacent modules was often shown as a tongue and groove assembly, any means of edge connection is possible, including mechanical clips, adhesives, "skewer" inserts which penetrate the insulation block, and other means. In addition, the positive connection between modules may be accomplished as follows. The photovoltaic modules may rest on spacers which in rum rest on insulation board which is loose laid on the roofing membrane. The photovoltaic modules may then span and be bonded to adjacent insulation blocks which would provide a positive connection between adjacent insulation blocks and adjacent photovoltaic modules. The latter would assist the assembly in resisting the forces of wind uplift.

As a further example, where there is a phase change material contained within a pre-formed insulation block, the insulation block may include a lining for containment of the phase change material.

As a further example, the top of all insulation blocks may be painted with a paint which is opaque to ultraviolet radiation, thereby lengthening the life of the insulation block in applications where the photovoltaic module is not opaque to ultraviolet radiation.

As a further example, the spacers need not be made integral with the photovoltaic module in the shop, but may be laid in the field as stringers and the PV modules attached thereto in the field.

Accordingly, the scope of the invention should be determined not by the embodiments illustrated, but by the appended claims and their legal equivalents.

I claim:

1. A photovoltaic roofing assembly, comprising:
   a roofing membrane;
   a plurality of photovoltaic modules disposed as a layer on top of said roofing membrane, and
   means for regulating the temperature of said photovoltaic modules.

2. The assembly of claim 1 wherein said means of temperature regulation includes a plurality of pre-formed spacers located below said photovoltaic modules, whereby said photovoltaic modules are separated from said roofing membrane by a pre-determined distance, thus enabling heat transfer from the backside of said photovoltaic modules to a convecting fluid.

3. The assembly of claim 2 wherein said spacers have a top surface which is joined to said photovoltaic modules, forming integral units.

4. The assembly of claim 3 wherein said integral units have adjoining sides and a joint is disposed between the photovoltaic modules of said integral units, whereby water may drain between said photovoltaic modules and whereby the pressure differential between the top and bottom sides of said photovoltaic modules due to windflow over the top of said photovoltaic modules is reduced.

5. The assembly of claim 4 wherein said integral units have a tapered profile, and the photovoltaic modules which are the top side of said integral units have a top surface which can be installed so as to face in a direction of increased sun exposure.

6. The assembly of claim 1 wherein said means of temperature regulation includes a phase change material together with a container for containing said phase change material, disposed as a layer below said plurality of photovoltaic modules.

7. The assembly of claim 6 wherein said container which contains said phase change material has a top surface which is joined to its respective photovoltaic module, forming a three-pan integral unit.

8. The assembly of claim 7 wherein each three-part integral unit has adjoining sides with a joint disposed between said sides for water drainage and for pressure equalization between the bottom and top sides of said three-part integral units.

9. The assembly of claim 8 wherein each of said three-pan integral units includes a container which is pre-formed to enable fluid convection along at least one surface to facilitate heat transfer away the phase change material which it contains.

10. The assembly of claim 9 wherein said three-pan integral unit has a tapered profile, and the photovoltaic module disposed as the top side of said three-part integral unit has a top surface which can be installed so as to face in a direction of increased sun exposure.

11. The assembly of claim 7 further including spacers which are joined on their top side to the bottom surface of said three-part integral units, with the bottom of said spacers resting on the roofing membrane.

12. The assembly of claim 11 wherein said three-part integral units with supporting spacers have adjoining sides and a joint disposed between said sides for water drainage and for pressure equalization between the bottom and top sides of said three-part integral units.

13. The assembly of claim 12 wherein said three-part integral units with supporting spacers have a tapered profile and the photovoltaic module disposed as the top side of said thru-part integral units has a top surface which can be installed so as to face in a direction of increased sun exposure.

14. The assembly of claim 12 wherein the container portion of said three-part integral units is an aluminum honeycomb.

15. The assembly of claim 14 wherein said three-part integral units have a tapered profile, and the top surface of said three-part integral units can be installed so as to lace in a direction of increased sun exposure.

16. A method of making a solar roofing assembly comprising: assembling photovoltaic modules having a bottom surface bonded to supporting spacers, thereby forming integral units; installing a roofing membrane over a roof; installing said integral units as a layer on top of said roofing membrane, whereby the completed assembly limits the temperatures experienced by the photovoltaic modules and eliminates the need for roofing penetrations for hold-down of said integral units.

17. A method of making a photovoltaic roofing assembly, comprising installing in the field a roofing membrane; installing in the field pre-formed spacers in substantially straight lines; and installing photovoltaic modules on top of said pre-formed spacers; whereby the completed assembly limits the temperatures experienced by the photovoltaic modules and eliminates the need for roofing penetrations for hold-down of any of its components.

18. A method of making a solar roofing assembly comprising: assembling photovoltaic modules having a bottom surface bonded to a container containing a phase change material, thereby forming three-part integral units; installing a roofing membrane over a roof; installing said integral units as a layer on top of said roofing membrane using supporting spacers; whereby the completed assembly has predetermined dimensions and edge connections which limit the temperatures experienced by the photovoltaic modules and eliminate the need for roofing penetrations for hold-down of its components.

19. A photovoltaic roofing assembly, comprising:
a roofing membrane;
a plurality of insulation blocks disposed as a layer on top of said roofing membrane;
a plurality of photovoltaic modules disposed as a layer on top of said insulation blocks; and
means for regulating the temperature of said photovoltaic modules.

20. The assembly of claim 19, wherein said means of temperature regulation includes pre-forming said insulation blocks with pre-determined grooves on their top surface, whereby a layer is formed on the top side of said insulation blocks which enables convective fluid flow for heat transfer away from the backside of said photovoltaic modules and allows pressure equalization between the bottom and top sides of said photovoltaic modules.

21. The assembly of claim 20 wherein each of said insulation blocks have adjoining sides with a joint disposed between said sides for water drainage.

22. The assembly of claim 21 wherein each of said insulation blocks has a top surface which is joined to its respective photovoltaic module, forming a two-part integral unit.

23. The assembly of claim 22 wherein each of said insulation blocks has a tapered profile, and said photovoltaic module disposed above said insulation block has a top surface which can be installed so as to face in a direction of increased sun exposure.

24. The assembly of claim 19 wherein said means of temperature regulation includes a plurality of pre-formed spacers which separate said photovoltaic modules from said insulation block, thus enabling heat transfer from the backside of said photovoltaic modules to a convecting fluid.

25. The assembly of claim 24 wherein each of said spacers has a top surface which is joined to its respective photovoltaic module, thus forming a two-part integral unit.

26. The assembly of claim 25 wherein each of said two-part integral units are attached on their bottom sides to the top surface of the insulation blocks, with a joint disposed between the sides of said two-part integral units for water drainage and for pressure equalization between the bottom and top sides of said two-part integral units.

27. The assembly of claim 26 wherein said two-part integral units have a tapered profile, and the photovoltaic module on the top side of said two-part integral units have a top surface which can be installed so as to face in a direction of increased sun exposure.

28. The assembly of claim 25 wherein each of said two-part integral units have adjoining sides with a joint disposed between said sides for water drainage and for pressure equalization between the bottom and top sides of the two-part integral units.

29. The assembly of claim 28 wherein each of said two-part integral units has a tapered profile, and the photovoltaic module on the top side of said two-part integral unit has a top surface which can be installed so as to lace in a direction of increased sun exposure.

30. The assembly of claim 19 wherein said means of temperature regulation includes a phase change material together with a container for containing said phase change material, disposed as a layer below said plurality of photovoltaic modules.

31. The assembly of claim 30 wherein said container has a top surface which is joined to its respective photovoltaic module, forming a two-part integral unit.

32. The assembly of claim 31 wherein said two-part integral units have adjoining sides with a joint disposed between said sides for water drainage and for pressure equalization between the bottom and top sides of said two-part integral units.

33. The assembly of claim 32 wherein the container portion of said two-part integral units is pre-formed to enable fluid convection along at least one surface to facilitate heat transfer away from the phase change material which it contains.

34. The assembly of claim 33 wherein said container has a tapered profile, and the photovoltaic module disposed above said container has a top surface which can be installed so as to face in a direction of increased sun exposure.

35. The assembly of claim 32 further including spacers which elevate said two-part integral units above said roofing membrane.

36. The assembly of claim 35 wherein said spacers have a tapered profile, and said two-part integral units disposed above said spacers have a top surface which can be installed so as to face in a direction of increased sun exposure.

37. The assembly of claim 35 wherein the container portion of said two-part integral units is an aluminum honeycomb which contains said phase change material.

38. The assembly of claim 37 wherein said spacers have a tapered profile, and said two-part integral units disposed above said spacers have a top surface which can be installed so as to face in a direction of increased sun exposure.

39. A method of making a solar roofing assembly comprising: pre-forming an insulation block to include channels on its top surface; assembling a photovoltaic module having a bottom surface bonded to said insulation block, thereby forming a two-part integral unit; installing a roofing membrane over a roof; installing said two-part integral units as a layer on top of said roofing membrane; installing roofing pavers around the perimeter areas of said two-part integral units; whereby the completed assembly limits the temperatures experienced by the photovoltaic modules and eliminates the need for roofing penetrations for hold-down of its components.

40. A method of making a photovoltaic rooting assembly, comprising installing in the field a roofing membrane over a roof; installing in the field a plurality of insulation blocks disposed as a layer on top of said roofing membrane; installing pre-formed spacers in substantially straight lines as a layer on top of said insulation blocks; installing photovoltaic modules on top of said pre-formed spacers; whereby the completed assembly limits the temperatures experienced by the photovoltaic modules and eliminates the need for roofing penetrations for hold-down of its components.

41. A method of making a photovoltaic roofing assembly, comprising assembling a photovoltaic module having a bottom surface attached to pre-formed spacers forming two-part integral units; installing in the field a roofing membrane over a roof; installing in the field a plurality of insulation blocks disposed as a layer on top of said roofing membrane; installing said two-part integral units as a layer on top of said insulation blocks; whereby the completed assembly limits the temperatures experienced by the photovoltaic modules and eliminates the need for roofing penetrations for hold-down of its components.

42. A method of making a solar roofing assembly comprising: assembling a photovoltaic module having a bottom surface bonded to a container which contains a phase change material, thereby forming a three-part integral unit; installing a roofing membrane over a roof; installing a plurality of insulation blocks as a layer on top of said roofing membrane; installing said three-part integral units as a layer on top of said insulation blocks; whereby the completed assembly eliminates the need for roofing penetrations for hold-down of its components and limits the temperatures experienced by the photovoltaic modules.

43. A method of making a solar roofing assembly comprising: assembling a photovoltaic module having a bottom surface bonded to a container which contains a phase change material, thereby forming a three-part integral unit; installing a roofing membrane over a roof; installing a plurality of insulation blocks as a layer on top of the roofing membrane; installing spacers as a layer on top of said insulation blocks; installing said three-part integral units as a layer on top of said spacers; whereby the completed assembly eliminates the need for roofing penetrations for hold-down of its components and limits the temperatures experienced by the photovoltaic modules and roofing membrane.

* * * * *